(12) United States Patent
Anzai et al.

(10) Patent No.: US 7,301,827 B2
(45) Date of Patent: Nov. 27, 2007

(54) SEMICONDUCTOR MEMORY DEVICE

(75) Inventors: Shinsuke Anzai, Tenri (JP); Masahiko Watanabe, Nara (JP); Takahiko Yoshimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 139 days.

(21) Appl. No.: 11/378,214

(22) Filed: Mar. 16, 2006

(65) Prior Publication Data

US 2006/0215468 A1 Sep. 28, 2006

(30) Foreign Application Priority Data

Mar. 16, 2005 (JP) .............................. 2005-075611

(51) Int. Cl.
*G11C 7/00* (2006.01)
(52) U.S. Cl. ..................... 365/189.05; 365/185.03; 365/185.21; 365/196; 365/205
(58) Field of Classification Search .......... 365/185.03, 365/185.21, 189.05, 196, 205
See application file for complete search history.

(56) References Cited

U.S. PATENT DOCUMENTS 5,457,650 A * 10/1995 Sugiura et al. ............. 365/184

6,356,486 B1 * 3/2002 Banks .................... 365/189.01
7,230,857 B2 * 6/2007 Hyun et al. ............ 365/189.03

FOREIGN PATENT DOCUMENTS

JP 5-100778 A 4/1993
JP 2003-008424 A 1/2003

* cited by examiner

*Primary Examiner*—Hoai V. Ho
(74) *Attorney, Agent, or Firm*—Morrison & Foerster LLP.

(57) ABSTRACT

In a semiconductor memory device for reading out multi-level data in a time-shared manner at different timings, by providing plural control signal lines for controlling the operation timings of the output buffer circuits, the operation timings of output buffer circuits can be displaced, and the number of output buffer circuits operating simultaneously can be decreased, with the result that noise is reduced. Besides, by allowing the output buffer circuit, which outputs data read out early in a time-shared manner, to operate at an early timing, data output is terminated without retarding the operation timing of the output buffer circuit operating at the last timing.

7 Claims, 6 Drawing Sheets

SEMICONDUCTOR MEMORY DEVICE

CROSS REFERENCE TO RELATED APPLICATION

This Nonprovisional application claims priority under 35 U.S.C. §119(a) on Patent Application No. 2005-075611 filed in Japan on Mar. 16, 2005, the entire contents of which are hereby incorporated by reference.

BACKGROUND OF THE INVENTION

1. Field of the Invention

The present invention relates to a semiconductor memory device, in particular, a semiconductor memory device having a data readout scheme based on a time-shared sensing scheme for reading out data of plural bits stored in a single memory cell in a time-shared manner.

2. Description of the Related Art

In general, a readout circuit of a semiconductor memory device supplies a current to a memory cell storing information, compares the current flowing through the memory cell (cell current) with a reference current, and determines whether the cell current is larger or smaller than the reference current, thereby taking out the information written in the memory cell. As such, a scheme for taking out information by comparison of the cell current is referred to as a current sensing scheme.

Figure 5A:
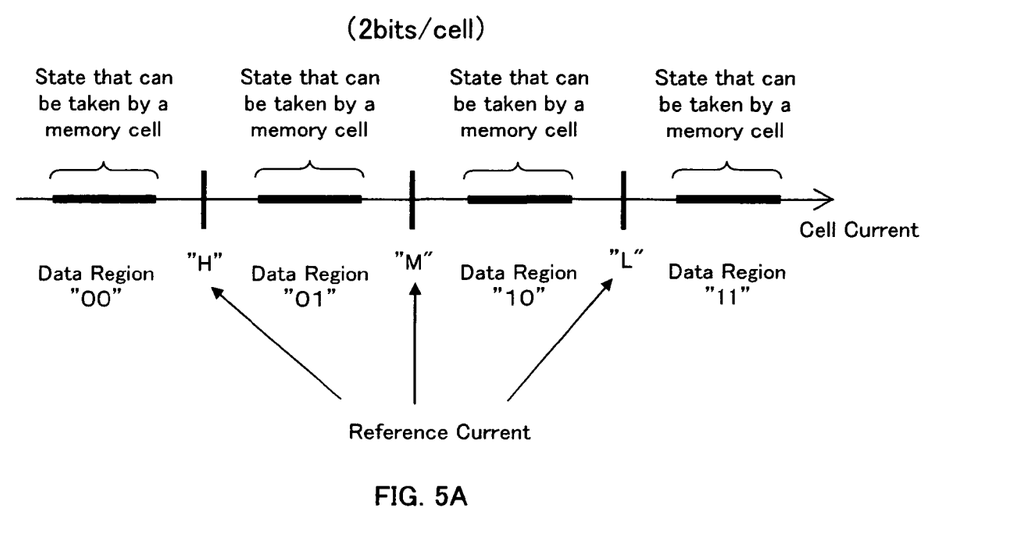
FIG. 5A shows one example of a relationship between a cell current and a data region in a multilevel type semiconductor memory device.
Figure 5B:
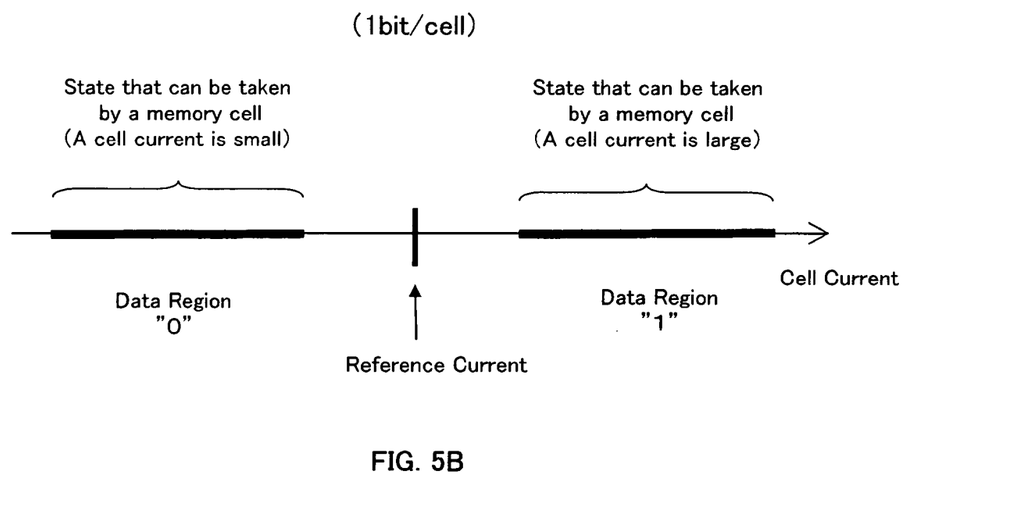
FIG. 5B shows one example of a relationship between a cell current and a data region in a binary type semiconductor memory device.

For example, in a so-called binary type semiconductor memory device wherein information of one bit is stored in one memory cell, as shown in FIG. 5B, there are prepared two states: a state where a cell current is large (corresponding to information "1") and a state where a cell current is small (corresponding to information "0") and a value of a reference current is set to an intermediate value between the two states; thus, it is possible to read out information of one bit. In practice, the semiconductor memory device is constructed so as to apply current-voltage conversion to the cell current and the reference current, respectively, to compare the respective potentials.

In recent years, in order to increase a memory capacity and reduce manufacturing cost of a semiconductor chip, there has been proposed a multilevel type semiconductor memory device capable of storing information of at least two bits in one memory cell.

In the multilevel type semiconductor memory device for storing information of two bits in one memory cell, for example, as shown in FIG. 5A, there are prepared four kinds of states that can be taken by a cell current to set three kinds of reference current values "H", "M" and "L" between the respective data regions, thereby making it possible to read out information of two bits. In the case of storing information of "n" bits in one memory cell in such a multilevel type semiconductor memory device, it is necessary to prepare $2^n$ kinds of states that can be taken by the cell current and set $(2^n-1)$ kinds of reference current values.

At present, upon reading out data from a multilevel type semiconductor memory device, several schemes are proposed. As one of such schemes, there can be mentioned a time-shared sensing scheme for performing sequential current comparison in a time-shared manner such as to perform a single kind of current comparison at a time and, depending on the result thereof, to perform current comparison on other state.

Hereinafter, as one example of the time-shared sensing scheme, description will be given of operations upon reading out data of 2-bit/cell shown in FIG. 5A with reference to FIGS. 3 and 4.

Figure 3:
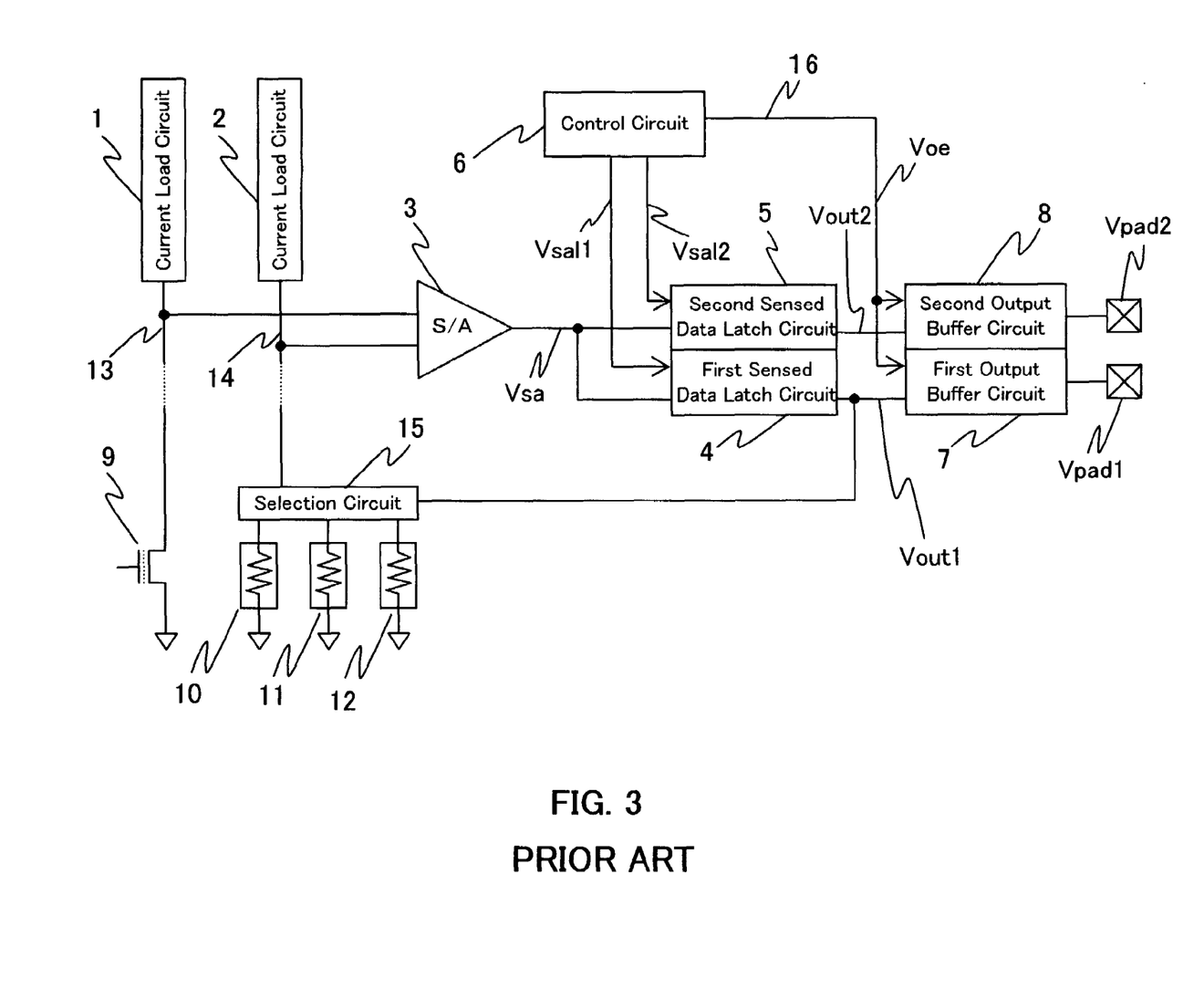
FIG. 3 is a block diagram showing a conventional semiconductor memory device.
Figure 4:
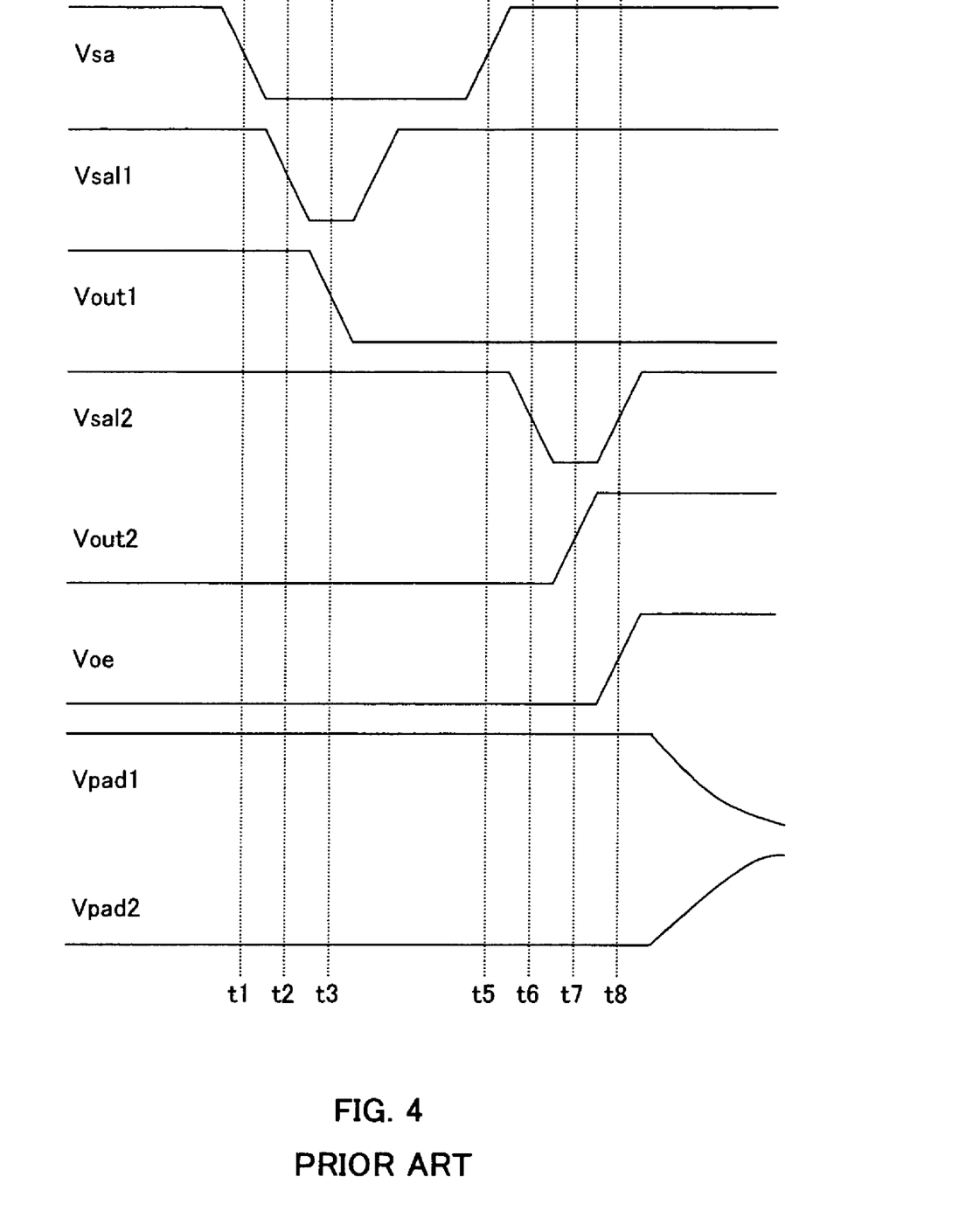
FIG. 4 is a timing chart for illustrating operations of the conventional semiconductor memory device shown in FIG. 3.

FIG. 3 is a block diagram showing an example of constitution of the readout circuit of the time-shared sensing scheme in the conventional multilevel type semiconductor memory device. This readout circuit using the time-shared sensing scheme includes a current load circuit 1, a current load circuit 2, a sense amplifier 3, a first sensed data latch circuit 4, a second sensed data latch circuit 5, a control circuit 6, a first output buffer circuit 7, a second output buffer circuit 8, reference current resources 10 to 12, a selection circuit 15, and the like.

In FIG. 3, the readout circuit using the time-shared sensing scheme includes the current load circuit 1 for obtaining a readout current (cell current) by giving a voltage to a drain (drain electrode) of a selected cell 9 which is a memory cell from which data is read out, and the current load circuit 2 for obtaining a reference current. Between the drain of the selected cell 9 and the current load circuit 1, there is connected a sensing line 13. To the current load circuit 2, there is connected a reference line 14. The sensing line 13 and the reference line 14 are connected with an input part of the sense amplifier 3 for outputting by amplification the potential difference between the sensing line 13 and the reference line 14.

To an output node Vsa of the sense amplifier 3, there are connected the first sensed data latch circuit 4 for latching a first time sensing result and the second sensed data latch circuit 5 for latching a second time sensing result. Further, the first sensed data latch circuit 4 and the second sensed data latch circuit 5 are connected with the control circuit 6, and receive a first sensed data latch control signal Vsal1 and a second sensed data latch control signal Vsal2, respectively, for controlling the timing of latching the data from the control circuit 6.

The first sensed data latch circuit 4 is connected with the selection circuit 15, and first sensed data Vout1 is outputted from the first sensed data latch circuit 4. The selection circuit 15 is connected to the reference current resources 10 to 12 and the reference line 14. At the time of the first sensing operation, the reference line 14 is connected to the reference current resource 10 by the selection circuit 15. At the time of the second sensing operation, the reference line 14 is connected by switching to the reference current resources 11 and 12 by the selection circuit 15 based on the first sensed data Vout1.

Further, connection is made between the first sensed data latch circuit 4 and the first output buffer circuit 7, and the first sensed data Vout1 outputted from the first sensed data latch circuit 4 is inputted to the first output buffer circuit 7. Then, connection is made between the second sensed data latch circuit 5 and the second output buffer circuit 8, and second sensed data Vout2 outputted from the second sensed data latch circuit 5 is inputted to the second output buffer circuit 8.

Besides, the control circuit 6 is connected to both the first output buffer circuit 7 and the second output buffer circuit 8 via a control signal line 16. A sensed data output control signal Voe for controlling the operation timing from the control circuit 6 is inputted simultaneously to both the first output buffer circuit 7 and the second output buffer circuit 8. Then, the sensed data are outputted from the first output buffer circuit 7 and the second output buffer circuit 8 to a first output pad Vpad1 and a second output pad Vpad2, respectively.

In the readout circuit using the time-shared sensing scheme, constituted as described above, data is read out from the selected cell 9 as follows. FIG. 4 is a timing chart of principal parts of FIG. 3 in the conventional readout operation. Herein, description will be given taking an example of a case where the selected cell stores data of "01". Also, the initial value of the output node Vsa of the sense amplifier 3 is assumed to be "1", and the initial values of the first sensed data latch circuit 4 and second sensed data latch circuit 5 are assumed to be "1" and "0", respectively.

First, by applying appropriate voltages to a gate (gate electrode) and a drain (drain electrode) of the selected cell 9, a cell current flowing through the selected cell 9 is generated. By the mutual dragging with the current load circuit 1 (voltage drop by the current load circuit 1), a sensing voltage is generated on the sensing line 13.

Similarly to the above, due to the mutual dragging between the reference current flowing through the reference current resource 10 selected by the selection circuit 15 and the current load circuit 2, a reference voltage is generated on the reference line 14.

The potential difference between the sensing voltage and reference voltage thus generated is outputted by amplification to the output node Vsa of the sense amplifier 3 (time t1). This operation is referred to as a first sensing operation. Herein, the reference current resource 10 selected by the selection circuit 15 at the time of the first sensing operation for obtaining the first sensed data Vout1 is used for obtaining a reference current value "M" between the data regions "01" and "10" out of the three reference currents shown in FIG. 5A. Ordinarily, as the reference current resources 10 to 12, there is used a reference cell having the same structure and same characteristics as those of the memory cell in which a threshold value is strictly adjusted so as to obtain an appropriate reference current. In this example, since the selected cell 9 stores the data of "01", "0" is outputted to the output node Vsa of the sense amplifier 3.

Then, the first sensed data latch control signal Vsal1 outputted from the control circuit 6 transits from "1" to "0" (time t2), and the first sensed data Vout1 is renewed to become Vout1=Vsa="0" and is stored in the first sensed data latch circuit 4 (time t3).

Next, based on the first sensed data Vout1 stored in the first sensed data latch circuit 4, the selection circuit 15 switches the reference current resource 10 to the reference current resource 11 or the reference current resource 12. At this time, in the case that the first sensed data Vout1 stored in the first sensed data latch circuit 4 is "0", switching is made to the reference current resource 11, and in case that the first sensed data Vout1 is "1", switching is made to the reference current resource 12. Herein, the reference current resource 11 is used for obtaining the reference current value "H" between the data regions "00" and "01" out of the three reference currents shown in FIG. 5A, and the reference current resource 12 is used for obtaining the reference current value "L" between the data regions "10" and "11". In this case, since the first sensed data Vout1 is "0", switching is made to the reference current resource 11.

Thereafter, a second sensing operation is performed in the same manner as the first sensing operation, so that a signal based on the potential difference between the sensing voltage and the reference potential of the resource 11 is amplified by the sense amplifier 3 and outputted to the output node Vsa of the sense amplifier (time t5). In this example, since the selected cell 9 stores the data of "01", "1" is outputted to the output node Vsa of the sense amplifier 3.

Then, the second sensed data latch control signal Vsal2 outputted from the control circuit 6 transits from "1" to "0" (time t6), and the second sensed data Vout2 is renewed to become Vout2=Vsa="1" and is stored in the second sensed data latch circuit 5 (time t7). As described above, it is possible to obtain data of two bits stored in one memory cell 9 as the first sensed data Vout1 and the second sensed data Vout2.

Finally, the sensed data output control signals Voe inputted simultaneously to both the first output buffer circuit 7 and the second output buffer circuit 8 from the control circuit 6 transit from "0" to "1" (time t8), the first output buffer circuit 7 and the second output buffer circuit 8 are simultaneously activated, and the first sensed data Vout1="0" and the second sensed data Vout2="1" are outputted to the first output pad Vpad1 and the second output pad Vpad2, respectively.

Figure 6:
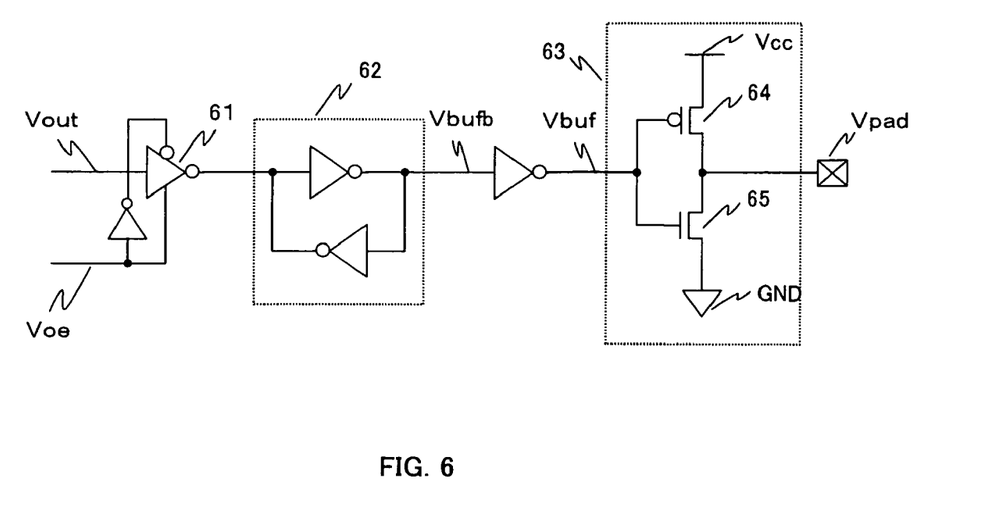
FIG. 6 shows one example of an output buffer circuit of the semiconductor memory device according to the present invention and the conventional semiconductor memory device.

FIG. 6 shows an example of constitution of the first output buffer circuit 7 and second output buffer circuit 8. The output buffer circuit includes an inverter 61 with an enable signal, to which sensing data Vout is inputted, a latch circuit 62, an output buffer 63, and the like. The inverter 61 with an enable signal acts as an inverter only when the sensed data output control signal Voe is "1", and enters a state of output high impedance when the signal Voe is "0". The output of the inverter 61 with an enable signal is connected to the latch circuit 62 by which the data is stably held, and the output buffer 63 outputs the data to the output pad Vpad. Further, as a Pch transistor 64 and an Nch transistor 65 of the output buffer 63, very large-sized transistors are used because of a necessity to output the data contained in a chip externally at high speed through the output pad Vpad.

Herein, when the sensed data output control signal Voe transits from "0" to "1" and the output buffer circuit is activated, if data Vbufb held by the latch circuit 62 differs from the sensed data Vout in this time, the data Vbufb held in the latch circuit 62 and inverse data Vbuf thereof are renewed, respectively. At this time, there arises a timing where the Pch transistor 64 and the Nch transistor 65 are simultaneously switched on; thus, a through current flows from a power source Vcc to a ground GND.

There is also a requirement in recent years to make the output multi-bits in a semiconductor memory device, and, in order to make the output multi-bits, it is necessary to provide an output buffer circuit for each bit. However, the noise of the output buffer 63 is increased as the amount of through current is larger, i.e., the larger the number of output buffers 63 operating simultaneously is, and the larger the size of the transistor of the output buffer 63 is. There is a problem that, in the event of the simultaneous switching of many of these output buffers 63, large noise generates due to the instantaneous flowing of large through current to induce erroneous operations to the peripheral apparatuses and own circuits.

It is possible to suppress through currents and reduce noise by lowering the current drivability of the transistors of the output buffers 63. Besides, there is disclosed a method for displacing timings of output for each bit by providing a delay circuit, thereby displacing peak timings of through currents flowing instantaneously and reducing noise (see, for example, JP-A 2003-8424, JP-A05-100778 (1993)).

However, lowering the current drivability of the transistors of the output buffers 63 induces retardation of the transition rate of the output voltage, i.e., retardation of the readout rate. Besides, when the noise reduction method disclosed in the aforementioned publications is applied to a semiconductor memory device, in consequence of the displacement of the output timings, readout rate is delayed by the displaced time. As such, in the case of using any of the aforementioned methods for a semiconductor memory device, there arises a problem of exerting an adverse effect to the readout rate.

SUMMARY OF THE INVENTION

The present invention has been made in view of the aforementioned problems. An object of the present invention is to provide a semiconductor memory device capable of reducing noise generated in consequence of the simultaneous switching of plural output buffers 63, and stably operating at high speed.

In order to attain the aforementioned object, a semiconductor memory device according to the present invention comprises: a memory cell capable of storing data of plural bits; a sense amplifier for reading the data out from the memory cell in plural times of sensing operations at different timings; plural output buffer circuits for outputting individually the sensed data detected by the respective sensing operations of the sense amplifier; and a control circuit for controlling the operation timing of the output buffer circuits. Herein, the control circuit has plural different control signal lines for controlling the operation timings of the output buffer circuits.

Furthermore, in the semiconductor memory device according to the present invention, the control circuit controls the plural output buffer circuits so that at least one of the plural output buffer circuits outputs the sensed data at the operation timing different from others.

More preferably, in the semiconductor memory device according to the present invention, the control circuit controls the plural output buffer circuits so that the respective plural output buffer circuits output the sensed data at the operation timing different from others.

Moreover, in the semiconductor memory device according to the present invention, between the two output buffer circuits having different operation timings to be controlled, the output buffer circuit having the earlier operation timing has a lower current drivability of a transistor constituting the output buffer circuit.

Moreover, in the semiconductor memory device according to the present invention, between the two output buffer circuits having different operation timings to be controlled, the output buffer circuit having the earlier operation timing has a shorter channel width of a transistor constituting the output buffer circuit.

According to the semiconductor memory device of the present invention, by providing plural control signal lines for controlling the timings for operating the output buffer circuits, the operation timings of the output buffer circuits can be displaced, and the number of the output buffer circuits operating simultaneously can be reduced, with the result that noise generated by the operations of the output buffer circuits can be reduced.

In addition, by controlling the output buffer circuit operating finally so as to operate at the exactly same timing as that of the conventional semiconductor memory device, it is possible to reduce only noise without sacrificing a readout rate.

DETAILED DESCRIPTION OF THE INVENTION

Hereinafter, description will be given of an embodiment of the present invention with reference to the drawings.

Figure 1:
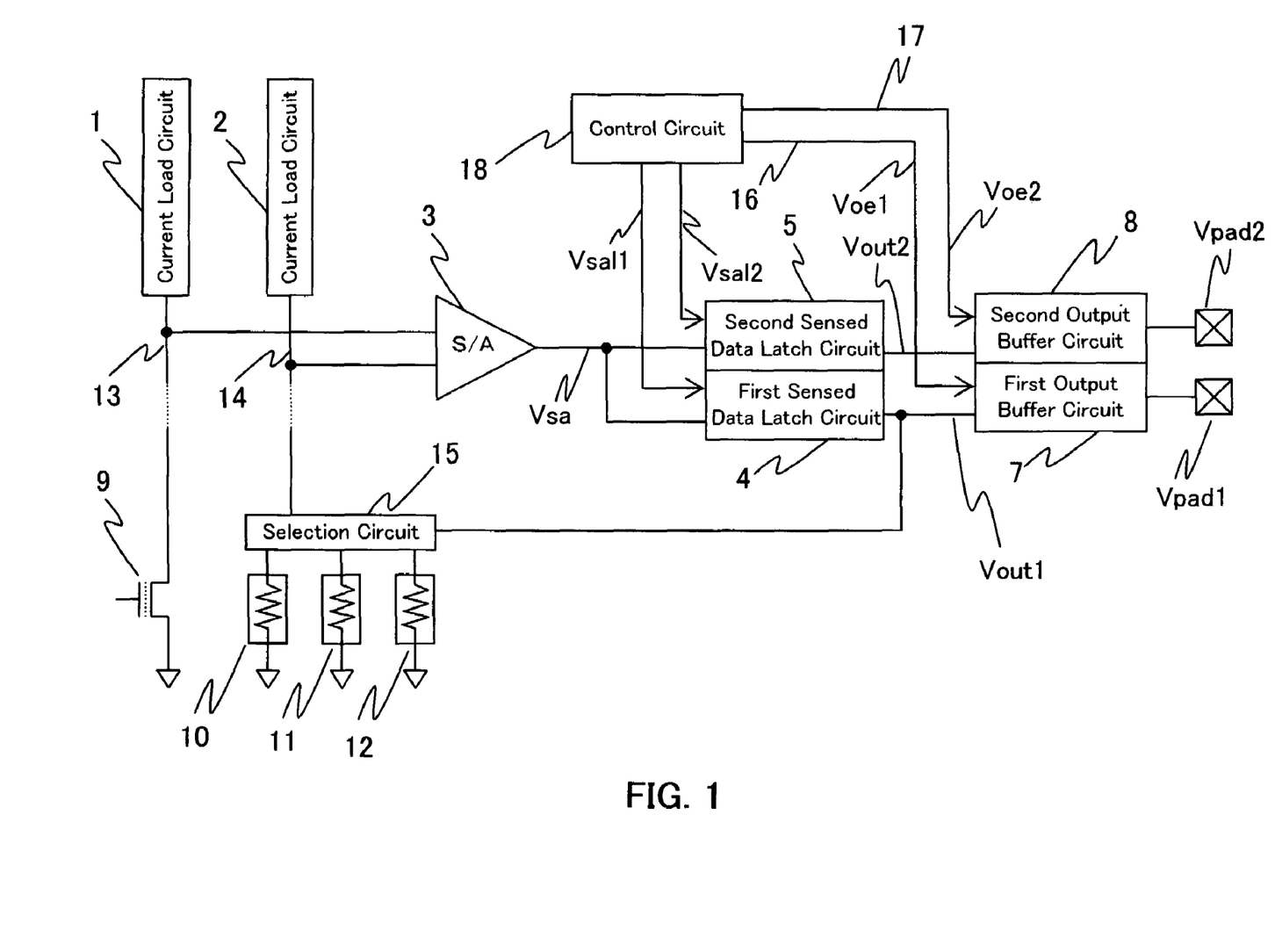
FIG. 1 is a block diagram showing one embodiment of a semiconductor memory device according to the present invention.

FIG. 1 is a block diagram showing an embodiment of a semiconductor memory device according to the present invention (hereinafter, appropriately referred to as "inventive device"). Herein, components having the same constitutions as those of the conventional components are denoted by the same reference numerals. The constitutional difference between this embodiment shown in FIG. 1 and the conventional embodiment shown in FIG. 3 is as follows. That is, the inventive device has a control signal line 16 for controlling the operation timing of a first output buffer circuit 7 by a first sensed data output control signal Voe1 from a control circuit 18 and a control signal line 17 for controlling the operation timing of a second output buffer circuit 8 by a second sensed data output control signal Voe2 from a control circuit 18. With the control signal lines 16, 17 from the control circuit 18, the inventive device can control the timing for operating the first output buffer circuit 7 and the timing for operating the second output buffer circuit 8 independently. Herein, as the output buffer circuits 7, 8, for example, the output buffer circuit illustrated in FIG. 6 can be used.

Hereinafter, detailed description will be given on the operations of the semiconductor memory device according to this embodiment having such a constitution.

Figure 2:
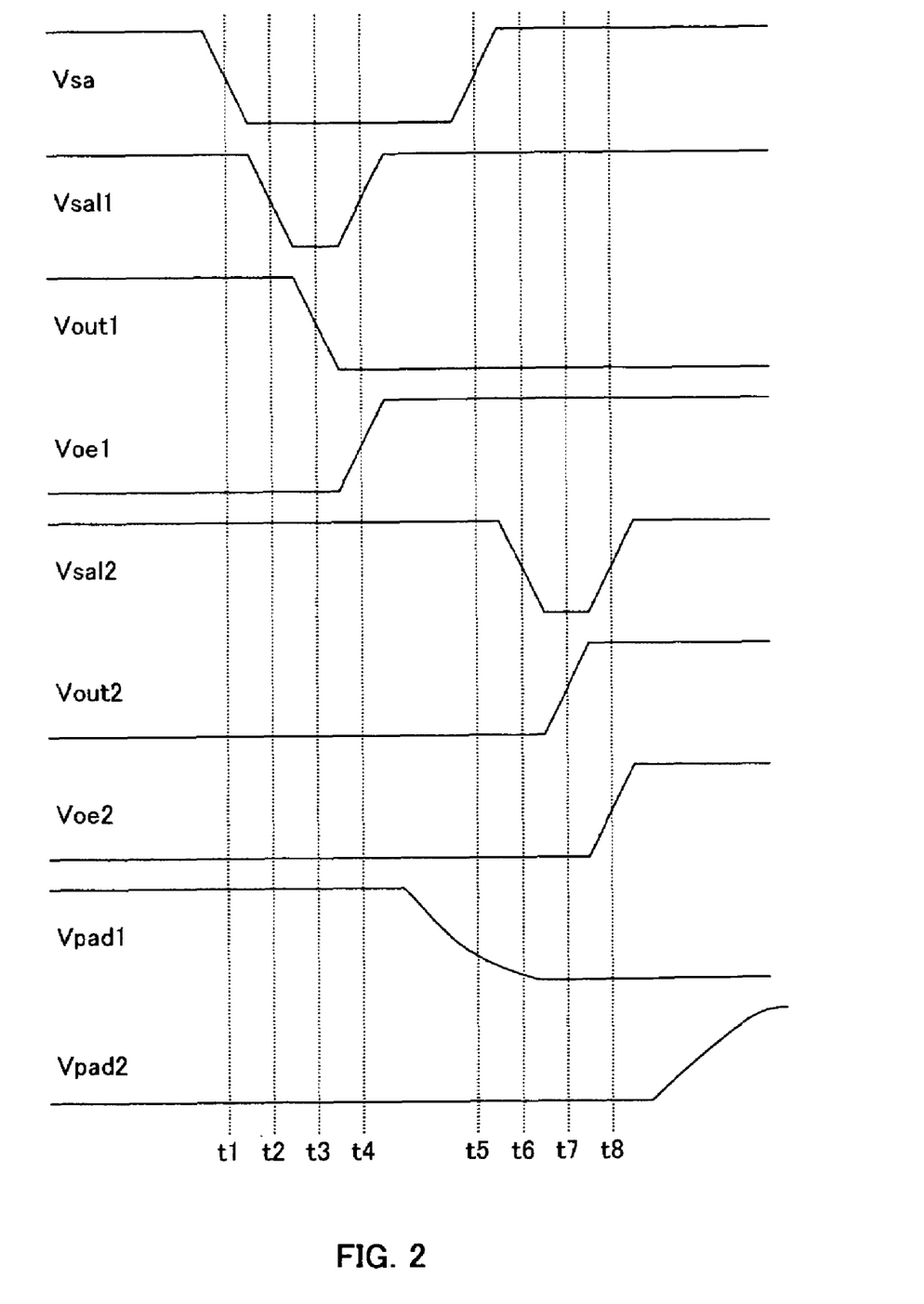
FIG. 2 is a timing chart for illustrating operations of the semiconductor memory device shown in FIG. 1.

FIG. 2 is a timing chart of principal parts of FIG. 1 in the readout operation of the semiconductor memory device shown in this embodiment according to a time-shared sensing scheme.

In this embodiment, description will be given of the operation at the time of reading out data of 2-bit/cell with reference to FIGS. 1 and 2. Also, in order to clarify the difference from the readout operation of the conventional semiconductor device, description will be made taking an example of the operation of reading out the same data under the same conditions as those in the conventional semiconductor device (taking an initial value of an output node Vsa of a sense amplifier 3 to be "1", initial values of a first sensed data latch circuit 4 and a second sensed data latch circuit 5 to be "1" and "0", respectively, and a selected cell 9 storing data of "01").

First, by applying appropriate voltages to a gate (gate electrode) and a drain (drain electrode) of the selected cell 9, a cell current flowing through the selected cell 9 is generated. By the mutual dragging with a current load circuit 1 (voltage drop by the current load circuit 1), a sensing voltage is generated in a sensing line 13.

Similarly to the above, due to the mutual dragging between a reference current flowing through a reference current resource 10 selected by a selection circuit 15 and a current load circuit 2, a reference voltage is generated on a reference line 14.

The potential difference between the sensing voltage and reference voltage thus generated is outputted by amplification to the output node Vsa of the sense amplifier 3 as a first sensing operation (time t1). In this embodiment, since the selected cell 9 stores the data of "01", "0" is outputted to the output node Vsa of the sense amplifier 3. Then, a first sensed data latch control signal Vsal1 outputted from the control circuit 18 transits from "1" to "0" (time t2), and first sensed data Vout1 is renewed to become Vout1=Vsa="0" and is stored in the first sensed data latch circuit 4 (time t3).

Next, the first sensed data output control signal Voe1 inputted to the first output buffer circuit 7 from the control circuit 18 transits from "0" to "1" (time t4), the first output buffer circuit 7 is activated, and the first sensed data Vout1="0" is outputted to a first output pad Vpad1.

Next, based on the first sensed data Vout1="0" stored in the first sensed data latch circuit 4, the selection circuit 15 changes over the reference current resource 10 to the reference current resource 11.

Thereafter, the second sensing operation is performed in the same manner as the first sensing operation, so that a signal based on the potential difference between the sensing voltage and the reference potential of the reference current resource 11 is outputted by amplification to the output node Vsa of the sense amplifier 3 (time t5). In this embodiment, since the selected cell 9 stores the data of "01", "1" is outputted to the output node Vsa of the sense amplifier 3. Then, a second sensed data latch control signal Vsal2 outputted from the control circuit 18 transits from "1" to "0" (time t6), and second sensed data Vout2 is renewed to become Vout2=Vsa="1" and is stored in the second sensed data latch circuit 5 (time t7).

Finally, the second sensed data output control signal Voe2 outputted from the control circuit 18 to the output buffer circuit 8 transits from "0" to "1" (time t8), the second output buffer circuit 8 is activated, and the second sensed data Vout2="1" is outputted to a second output pad Vpad2.

The readout operation according to this embodiment is as described above. The difference in the readout operation between this embodiment and the conventional device is as follows. That is, in this embodiment, by the independent provision of the control signal line 16 for controlling the operation timing of the first output buffer circuit 7 and the control signal line 17 for controlling the operation timing of the second output buffer circuit 8, the timing for operating the first output buffer circuit 7 and that for operating the second output buffer circuit 8 are displaced. However, the timing for operating the second output buffer circuit 8 (time t8) in this embodiment is entirely same as the timing for operating the second output buffer circuit 8 (time t8) in the conventional device.

As described above, according to the semiconductor memory device of the present invention, by providing plural control signal lines for controlling the timings for operating the output buffer circuits, the timings for operating the output buffers may be displaced and the number of output buffer circuits operating simultaneously may be reduced, with the result that noise generated by the operations of the output buffer circuits can be lowered.

Furthermore, since the output buffer circuit operating finally is operated at the entirely same timing as that of the conventional semiconductor memory device, it is possible to reduce only noise without sacrificing a readout rate.

In this embodiment, immediately after the renewal of the first sensed data Vout1 and storage in the first sensed data latch circuit 4 (time t3), the first output buffer circuit 7 is activated by the first sensed data output control signal Voe1 and the first sensed data Vout1 is outputted to the first output pad Vpad1. However, the timing for activating the first output buffer circuit 7 is not limited thereto; noise reduction can be similarly achieved if the first output buffer circuit 7 is operated before activating the second output buffer circuit 8 (time t8).

In the aforementioned embodiment, description is given of the case where the first output buffer circuit 7 has the entirely same constitution as that of the second output buffer circuit 8. However, since the output transition from the first output buffer circuit 7 to the first output pad Vpad1 may be terminated before completion of output transition from the second output buffer circuit 8 to the second output pad Vpad2, it is possible to lower the current drivability of a transistor constituting the first output buffer circuit 7, for example, a transistor in the output stage, to a level lower than that of the second output buffer circuit 8, so that it is possible to further reduce noise by this constitution.

Furthermore, as the means for lowering the current drivability of the aforementioned transistor, the channel width of the transistor may be shortened, thereby making it possible to reduce a chip area and a mounting area of a semiconductor device. As a result, it becomes possible to realize cost reduction and facilitate installation on a small-sized apparatus.

Moreover, in the aforementioned embodiment, the block constitution shown in FIG. 1 is an example, and the present invention is not to be limited to the constitution of FIG. 1. While the present invention has been described taking an example of the case where the number of storage states per memory cell is four (4-value memory), the number of storage states per memory cell is not to be limited to four, but the similar way of thinking is applicable when the number of storage states is four or more. Accordingly, the number of output buffer circuits to be connected to one sense amplifier is not limited to two.

For example, in the case where the number of storage states per memory cell is eight (8-value memory), to and on one sense amplifier, there are connected three output buffer circuits: the first output buffer circuit for outputting the first sensed data, the second output buffer circuit for outputting the second sensed data and the third output buffer circuit for outputting the third sensed data, and there are provided at least two control signal lines for controlling the operation timings of the three output buffer circuits. Therefore, it becomes possible to displace at least one operating timing in the three output buffer circuits, and to reduce noise in the similar manner. In other words, since it becomes possible to operate the first output buffer circuit or the second output buffer circuit, or both of them simultaneously, prior to the third output buffer circuit operating finally, noise reduction can be achieved.

Furthermore, by providing a control signal line on each of the three output buffer circuits, it becomes possible to operate all of the three output buffer circuits independently; thus, noise reduction can be further achieved.

Moreover, in the case of the aforementioned 8-value memory, when, for example, the first output buffer circuit and the second output buffer circuit are operated simultaneously prior to the operation of the third output buffer circuit, it is possible to lower the current drivability of the transistors constituting the first output buffer circuit and the second output buffer circuit to a level lower than the current drivability of the transistor constituting the third output buffer circuit. With this constitution, noise reduction can be further achieved.

Furthermore, in the case of operating all the three output buffer circuits independently, it is possible to lower the current drivability of the transistor constituting the first output buffer circuit to a level lower than that of the second output buffer circuit and to lower the current drivability of the transistor constituting the second output buffer circuit to a level lower than that of the third output buffer circuit. With this constitution, noise reduction can be further achieved.

Furthermore, as the means for lowering the current drivability of the aforementioned transistor, the channel width of the transistor may be shortened, thereby making it possible to reduce a chip area and a mounting area of a semiconductor device. As a result, it becomes possible to realize cost reduction and facilitate installation on a small-sized apparatus.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
    a memory cell capable of storing data of plural bits;
    a sense amplifier for reading the data out from the memory cell in plural times of sensing operations at different timings;
    plural output buffer circuits for outputting individually the sensed data detected by the respective sensing operations of the sense amplifier; and
    a control circuit for controlling the operation timing of the output buffer circuits, wherein
    the control circuit has plural different control signal lines for controlling the operation timings of the output buffer circuits.

2. The semiconductor memory device according to claim 1, wherein
    the control circuit controls the plural output buffer circuits so that at least one of the plural output buffer circuits outputs the sensed data at the operation timing different from others.

3. The semiconductor memory device according to claim 2, wherein
    between the two output buffer circuits having different operation timings to be controlled, the output buffer circuit having the earlier operation timing has a lower current drivability of a transistor constituting the output buffer circuit.

4. The semiconductor memory device according to claim 2, wherein between the two output buffer circuits having different operation timings to be controlled, the output buffer circuit having the earlier operation timing has a shorter channel width of a transistor constituting the output buffer circuit.

5. The semiconductor memory device according to claim 1, wherein
    the control circuit controls the plural output buffer circuits so that the respective plural output buffer circuits output the sensed data at the operation timing different from others.

6. The semiconductor memory device according to claim 5, wherein
    between the two output buffer circuits having different operation timings to be controlled, the output buffer circuit having the earlier operation timing has a lower current drivability of a transistor constituting the output buffer circuit.

7. The semiconductor memory device according to claim 5, wherein
    between the two output buffer circuits having different operation timings to be controlled, the output buffer circuit having the earlier operation timing has a shorter channel width of a transistor constituting the output buffer circuit.

* * * * *